United States Patent
Lee et al.

(10) Patent No.: US 10,995,269 B2
(45) Date of Patent: May 4, 2021

(54) ETCHANT COMPOSITION AND METHOD OF FABRICATING INTEGRATED CIRCUIT DEVICE USING THE SAME

(71) Applicant: SAMSUNG ELECTRONICS CO., LTD., Suwon-si (KR)

(72) Inventors: Jin-Woo Lee, Hwaseong-si (KR); Hoon Han, Anyang-si (KR); Keon-Young Kim, Seongnam-si (KR); Jung-Hun Lim, Daejeon (KR); Jin-Uk Lee, Sejong-si (KR); Jae-Wan Park, Daegu (KR)

(73) Assignees: Samsung Electronics Co., Ltd., Suwon-si (KR); Soulbrain Co., Ltd., Seongnam-si (KR)

( * ) Notice: Subject to any disclaimer, the term of this patent is extended or adjusted under 35 U.S.C. 154(b) by 0 days.

(21) Appl. No.: 15/816,699

(22) Filed: Nov. 17, 2017

(65) Prior Publication Data

US 2018/0142151 A1 May 24, 2018

(30) Foreign Application Priority Data

May 25, 2017 (KR) .......................... 10-2017-0064882

(51) Int. Cl.
*C09K 13/08* (2006.01)
*H01L 27/1157* (2017.01)
(Continued)

(52) U.S. Cl.
CPC ........ *C09K 13/08* (2013.01); *H01L 21/31111* (2013.01); *H01L 27/1157* (2013.01); *H01L 27/11582* (2013.01); *C09K 13/06* (2013.01)

(58) Field of Classification Search
CPC .......................... C09K 13/08; H01L 21/31111
See application file for complete search history.

(56) References Cited

U.S. PATENT DOCUMENTS 8,821,752 B2   9/2014   Cho et al.
9,136,120 B2   9/2015   Hong et al.
(Continued)

FOREIGN PATENT DOCUMENTS

CN   103160282 A   6/2013
CN   103540321 A   1/2014
(Continued)

OTHER PUBLICATIONS

Chinese Office Action dated Sep. 28, 2020 Cited in Chinese Corresponding Application No. CN 201711188427.9.

*Primary Examiner* — Thomas T Pham
(74) *Attorney, Agent, or Firm* — Volentine, Whitt & Francos, PLLC

(57) ABSTRACT

An etchant composition includes an inorganic acid, a siloxane compound, an ammonium compound, and a solvent, wherein the siloxane compound is represented by General Formula (I):

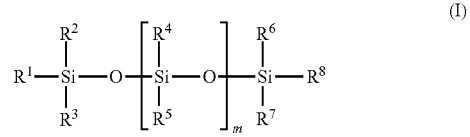

A method of fabricating an integrated circuit device includes forming a structure on a substrate, the structure having a surface on which an oxide film and a nitride film are exposed; and selectively removing the nitride film from the oxide film and the nitride film by bringing the etchant composition into contact with the structure.

8 Claims, 14 Drawing Sheets

(51) Int. Cl.
    *H01L 21/311*    (2006.01)
    *H01L 27/11582*  (2017.01)
    *C09K 13/06*     (2006.01)

(56) References Cited

U.S. PATENT DOCUMENTS

| | | |
|---|---|---|
| 9,368,647 B2 | 6/2016 | Hong et al. |
| 10,332,784 B2 | 6/2019 | Casteel, Jr. et al. |
| 2008/0203060 A1 | 8/2008 | Hara et al. |
| 2013/0092872 A1 | 4/2013 | Hong et al. |
| 2014/0023827 A1 | 1/2014 | Shim |
| 2015/0140906 A1* | 5/2015 | Morinaga ............... C23G 1/06 451/54 |
| 2016/0126107 A1 | 5/2016 | Kil et al. |
| 2016/0237379 A1* | 8/2016 | Chow .................... C11D 1/10 |

FOREIGN PATENT DOCUMENTS

| | | |
|---|---|---|
| CN | 106010826 A | 10/2016 |
| KR | 1020140079267 A | 6/2014 |
| KR | 101468406 B1 | 11/2014 |
| KR | 1020160010312 A | 1/2016 |

\* cited by examiner

ETCHANT COMPOSITION AND METHOD OF FABRICATING INTEGRATED CIRCUIT DEVICE USING THE SAME

CROSS-REFERENCE TO RELATED APPLICATION

A claim for priority under 35 U.S.C. § 119 is made to Korean Patent Application No. 10-2016-0157440, filed on Nov. 24, 2016 and Korean Patent Application No. 10-2017-0064882, filed on May 25, 2017 in the Korean Intellectual Property Office, the entire contents of which are hereby incorporated by reference.

BACKGROUND

The present inventive concept herein relates to an etchant composition and a method of fabricating an integrated circuit device using the same, and more particularly, to an etchant composition for etching a nitride film and a method of fabricating an integrated circuit device using the etchant composition.

As multifunctional information communication devices have recently been developed, there has been demand to increase the capacity and integration of integrated circuit devices including memory devices used in such communication devices. As the size of memory cells has been reduced so as to realize high integration, operation circuits and connective wiring structures included in memory devices are becoming complicated. In processes of fabricating highly down-scaled integrated circuit devices, oxide films and nitride films, which are generally used as insulating films, may be used alone or alternately stacked. In addition, processes of selectively etching nitride films having variously shaped patterns may be required to form electronic devices having complicated and fine structure such as 3-dimensional structures for example. In particular, there is a need for an etchant composition that does not cause generation of unnecessary particles or undesired abnormal growth of by-products on a surface of an oxide film during a nitride film etching process, and which provides sufficient nitride film-to-oxide film etch selectivity.

SUMMARY

Embodiments of the inventive concepts provide an etchant composition, which does not cause generation of unnecessary particles or undesired abnormal growth of by-products on a surface of an oxide film during a nitride film etching process, and which provides sufficient nitride film-to-oxide film etch selectivity.

Embodiments of the inventive concepts also provide a method of fabricating an integrated circuit device, whereby stability and reliability of a nitride film etching process may be secured and productivity of a fabrication process of the integrated circuit device may be increased, without causing the generation of unnecessary particles or undesired abnormal growth of by-products on a surface of an oxide film during etching of variously shaped nitride films, and sufficient nitride film-to-oxide film etch selectivity is secured so that an electronic device having a complicated and fine structure may be fabricated.

Embodiments of the inventive concepts provide an etchant composition including an inorganic acid, a siloxane compound, an ammonium compound, and a solvent, wherein the siloxane compound is represented by General Formula (I):

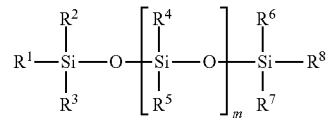

wherein m is an integer of 0 to 5; and
$R^1$, $R^2$, $R^3$, $R^4$, $R^5$, $R^6$, $R^7$, and $R^8$ are each independently a hydrogen atom, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a phosphate group, a sulfate group, a nitrile group, a carboxyl group, or a substituent represented by General Formula (II):

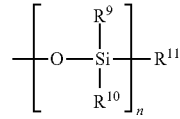

wherein n is an integer of 0 to 5; and
$R^9$, $R^{10}$, and $R^{11}$ are each independently a hydrogen atom, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a phosphate group, a sulfate group, a nitrile group, or a carboxyl group.

Embodiments of the inventive concepts further provide a method of fabricating an integrated circuit device, the method including: forming a structure on a substrate, the structure having a surface, at which an oxide film and a nitride film are exposed; and selectively removing the nitride film from the oxide film and from the nitride film by bringing an etchant composition according to the inventive concepts into contact with the structure.

Embodiments of the inventive concepts still further provide a method of fabricating an integrated circuit device, the method including: forming a structure on a substrate by alternately stacking a plurality of oxide films and a plurality of nitride films layer by layer; forming a cut region by partially removing each of the plurality of oxide films and the plurality of nitride films, the cut region having an inner sidewall, at which the plurality of oxide films and the plurality of nitride films are exposed; and selectively removing the plurality of nitride films from among the plurality of oxide films and the plurality of nitride films through the cut region by bringing an etchant composition according to the inventive concepts into contact with the structure.

Embodiments of the inventive concepts still further provide an etchant composition including phosphoric acid in an amount of about 85 weight % (wt %) of a total amount of the etchant composition; a siloxane compound including 1,5-trisiloxanediol, 1,1,3,3,5,5-hexamethyl-, diacetate in an amount of about 1.5 wt % of the total amount of the etchant composition; ammonium phosphate in an amount of about 0.5 wt % of the total amount of the etchant composition; a solvent; and trimethylamine in an amount of about 2.0 wt % of the total amount of the etchant composition.

Embodiments of the inventive concepts also provide an etchant composition including phosphoric acid in an amount of about 85 weight % (wt %) of a total amount of the etchant composition; a siloxane compound including dimethoxypropan-2-yl-trimethylsilyloxysilane in an amount of about 1.0 wt % of the total amount of the etchant composition; ammonium phosphate in an amount of about 0.5 wt % of the total amount of the etchant composition; and a solvent.

When a nitride film is etched using the etchant composition according to embodiments of the inventive concepts, even though the nitride film and an oxide film are alternately stacked or mixed, only the nitride film is selectively etched with a relatively high nitride film-to-oxide film etch selectivity of about 200:1 to about 600:1. Therefore, while the nitride film having variously shaped patterns is etched in order to form an electronic device having a complicated and fine structure, sufficient nitride film-to-oxide film etch selectivity is secured simultaneously without causing problems such as the generation of unnecessary particles or undesired abnormal growth of by-products on a surface of the oxide film. The stability and reliability of a nitride film etching process may be secured, and productivity of a fabrication process of an integrated circuit device and the reliability of the integrated circuit device may be improved by preventing damage to the oxide film, which along with the nitride film is exposed to the etchant composition, and by preventing deterioration of electrical properties of the oxide film.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
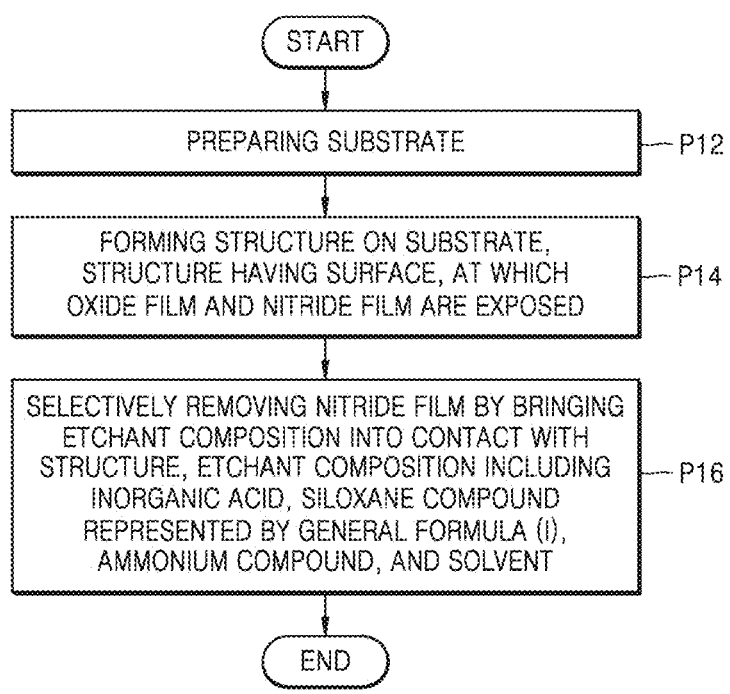
FIG. 1 illustrates a flowchart of a method of fabricating an integrated circuit device, according to embodiments of the inventive concept.

Hereinafter, embodiments of the inventive concept will be described in detail with reference to the accompanying drawings. Like components will be denoted by like reference numerals throughout the specification, and repeated descriptions thereof will be omitted.

As used herein, the term "C1 to C20 alkyl group" refers to a linear or branched non-cyclic saturated aliphatic hydrocarbon group having 1 to 20 carbon atoms. As used herein, the term "C2 to C20 alkenyl group" refers to a linear or branched non-cyclic unsaturated aliphatic hydrocarbon group having 2 to 20 carbon atoms and one or more double bonds between adjacent carbon atoms. As used herein, the term "C2 to C20 alkynyl group" refers to a linear or branched non-cyclic unsaturated aliphatic hydrocarbon group having 2 to 20 carbon atoms and one or more triple bonds between adjacent carbon atoms. As used herein, the term "C1 to C20 alkoxy group" refers to a linear or branched non-cyclic saturated or unsaturated aliphatic hydrocarbon group having one or more ether groups and 1 to 20 carbon atoms.

An etchant composition according to embodiments of the inventive concepts includes an inorganic acid, a siloxane compound, an ammonium compound, and a solvent.

The inorganic acid may include sulfuric acid, nitric acid, phosphoric acid, silicic acid, hydrofluoric acid, boric acid, hydrochloric acid, perchloric acid, or combinations of two or more thereof.

The siloxane compound may be represented by General Formula (I):

General Formula (I)

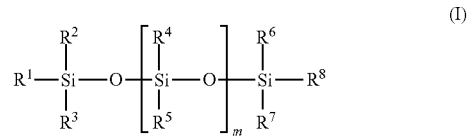

wherein m is an integer of 0 to 5; and $R^1$, $R^2$, $R^3$, $R^4$, $R^5$, $R^6$, $R^7$, and $R^8$ are each independently a hydrogen atom, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a phosphate group, a sulfate group, a nitrile group, a carboxyl group, or a substituent represented by General Formula (II):

General Formula (II)

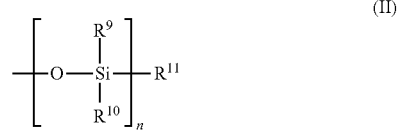

wherein n is an integer of 0 to 5; and $R^9$, $R^{10}$, and $R^{11}$ are each independently a hydrogen atom, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a phosphate group, a sulfate group, a nitrile group, or a carboxyl group.

In the siloxane compound as expressed using General Formula (I), the expression "$R^1$, $R^2$, $R^3$, $R^4$, $R^5$, $R^6$, $R^7$, and $R^8$ are each independently . . . " should be understood to mean for instance that $R^1$ may be one of the identified groups, while $R^2$, $R^3$, $R^4$, $R^5$, $R^6$, $R^7$, and $R^8$ may be different ones of the identified groups. For example, $R^1$ may be a hydrogen atom, and $R^2$ through $R^8$ may be a C1 to C20 alkyl group. As another example, $R^1$ may be a hydrogen atom, $R^2$ may be a C1 to C20 alkyl group, and $R^3$ may be a C2 to C20 alkenyl group, and $R^4$ through $R^8$ may be other ones of the identified group.

Somewhat similarly, in the siloxane group as expressed using General Formula (II), the expression "$R^9$, $R^{10}$, and $R^{11}$ are each independently . . . " should be understood to mean for instance that $R^9$ may be one of the identified groups, while $R^{10}$ and $R^{11}$ may be different ones of the identified groups. For example, $R^9$ may be a hydrogen atom, and $R^{11}$ and $R^{12}$ may be a C1 to C20 alkyl group. As another example, $R^9$ may be a hydrogen atom, $R^{10}$ may be a C1 to C20 alkyl group, and $R^{11}$ may be another one of the identified group.

In some embodiments, in General Formula (I), at least one of $R^1$, $R^2$, $R^3$, $R^4$, $R^5$, $R^6$, $R^7$, and $R^8$ may be a substituent represented by General Formula (II). For example, the siloxane compound represented by General Formula (I) may be represented by one of General Formula (III), General Formula (IV), and General Formula (V), although the inventive concepts are not limited thereto.

General Formula (III)

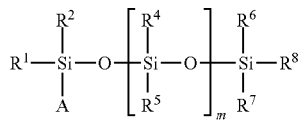

(III)

General Formula (IV)

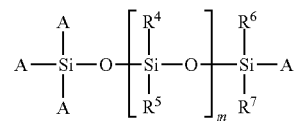

(IV)

General Formula (V)

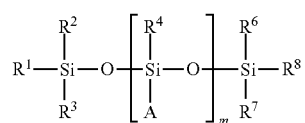

(V)

wherein A is a substituent represented by General Formula (II).

In some embodiments, the siloxane compound may include compounds represented by Chemical Formulae (1) to (5), although these are merely examples and the inventive concepts are not limited thereto.

Chemical Formula (1)

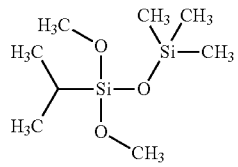

(dimethoxy-propan-2-yl-trimethylsilyloxysilane;
CAS No. 141192-68-9)

Chemical Formula (2)

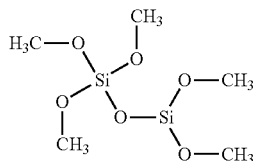

(dimethoxysilyl trimethyl silicate;
CAS No. 139485-19-1)

Chemical Formula (3)

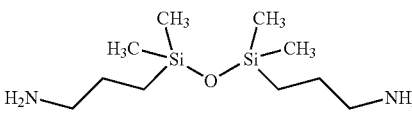

(3-[[3-aminopropyl(dimethyl)silyl]oxy-dimethylsilyl]propan-1-amine;
CAS No. 2469-55-8)

Chemical Formula (4)

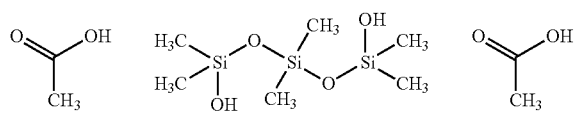

(1,5-Trisiloxanediol, 1,1,3,3,5,5-hexamethyl-, diacetate;
CAS No. 5314-59-0)

Chemical Formula (5)

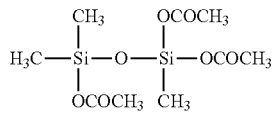

(Triacetoxyl-trimethyl-disiloxane)

A compound represented by Chemical Formula (5) may be obtained by reacting dichloro-[chloro(dimethyl)silyl]oxy-methylsilane (CAS No. 4617-28-1) with acetic acid at room temperature according to Reaction Formula (1).

Reaction Formula (1)

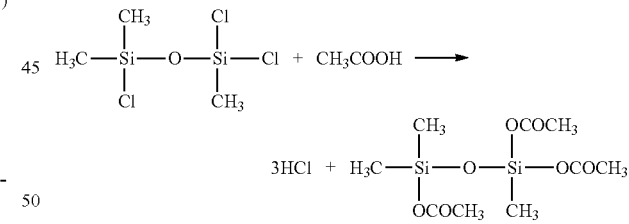

In the etchant composition according to embodiments of the inventive concepts, the ammonium compound may include ammonium hydroxide, ammonium chloride, ammonium acetate, ammonium phosphate, ammonium peroxydisulfate, ammonium sulfate, an ammonium hydrofluoric acid salt, ammonia, or combinations of two or more thereof.

In the etchant composition according to embodiments of the inventive concepts, the solvent may include deionized water (i.e., DIW).

In the etchant composition according to embodiments of the inventive concepts, the inorganic acid may serve as an etchant for etching a nitride film. In some embodiments, the inorganic acid may include phosphoric acid. Phosphoric acid may promote the etching of a nitride film by providing hydrogen ions into the etchant composition. In some other embodiments, the inorganic acid may include a combination of phosphoric acid and sulfuric acid. Sulfuric acid may promote the etching of a nitride film by increasing a boiling point of the etchant composition including phosphoric acid. The inorganic acid may be present in an amount of about 70% by weight (wt %) to about 99 wt % based on a total amount of the etchant composition. For example, the inorganic acid may be present in an amount of about 75 wt % to about 85 wt % based on the total amount of the etchant composition. If the amount of the inorganic acid in the etchant composition is too low, a nitride film may not be easily etched and there is a concern of particle generation, and if the amount of the inorganic acid in the etchant composition is too high, it may be difficult to secure high nitride film-to-oxide film etch selectivity upon the etching of a nitride film.

In the etchant composition according to embodiments of the inventive concepts, the siloxane compound may improve nitride film-to-oxide film etch selectivity. The siloxane compound may be present in an amount of about 0.01 wt % to about 15 wt % based on the total amount of the etchant composition. In one embodiment, the siloxane compound may be present in an amount of about 0.5 wt % to about 15 wt % based on the total amount of the etchant composition. In another embodiment, the siloxane compound may be present in an amount of about 1 wt % to about 15 wt % based on the total amount of the etchant composition. In a further embodiment, the siloxane compound may be present in an amount of about 3 wt % to about 7 wt % based on the total amount of the etchant composition. If the amount of the siloxane compound in the etchant composition is too low, it may be difficult to secure high nitride film-to-oxide film etch selectivity, and if the amount of the siloxane compound in the etchant composition is too high, it may be difficult to anticipate further improved effects caused by an increase of the amount of the siloxane compound, and an effect of thermal decomposition of the siloxane compound may be reduced.

In the etchant composition according to embodiments of the inventive concepts, the ammonium compound may maintain an etch rate of a nitride film constant, when the nitride film is etched by using the etchant composition. The etchant composition includes the ammonium compound, whereby reduction in etch rate or change in etch selectivity may be prevented even though the etchant composition is used for a long period of time. The ammonium compound may be present in an amount of about 0.01 wt % to about 20 wt % based on the total amount of the etchant composition. If the amount of the ammonium compound is too low, an effect of maintaining the etch selectivity of a nitride film constant may be reduced when the etchant composition is used for a long period of time, and if the amount of the ammonium compound is too high, etch rates of a nitride film and an oxide film may be changed and thus lead to change in etch selectivity of the nitride film.

In some embodiments of the inventive concepts, the ammonium compound may include a compound having an ammonium ion. For example, the ammonium compound may include ammonia. In this case, the etchant composition may include phosphoric acid and hydrochloric acid as the inorganic acid.

In the etchant composition according to embodiments of the inventive concepts, in the case that the inorganic acid includes phosphoric acid, phosphoric acid may etch silicon nitride by reacting with silicon nitride when a silicon nitride film is etched by using the etchant composition. Silicon nitride may generate silicic acid by reacting with phosphoric acid. Silicic acid may cause an abnormal growth phenomenon in which silicic acid is adsorbed onto a surface of an oxide film and thus increases the thickness of the oxide film, the oxide film being exposed to the etchant composition together with the silicon nitride film upon the etching of the silicon nitride film. In particular, when a nitride etching process is repeatedly performed using the etchant composition, the concentration of silicic acid in the etchant composition may increase. As the concentration of silicic acid in the etchant composition increases, the possibility of occurrence of the abnormal growth phenomenon, in which the thickness of the oxide film increases, may increase. The etchant composition according to embodiments includes the ammonium compound. An ammonium ion obtained from the ammonium compound may be present in the etchant composition. In the etchant composition, the ammonium ion may be bonded to silicic acid and thus generate a water-soluble compound, thereby preventing the abnormal growth phenomenon, in which the thickness of the oxide film increases. As such, the etchant composition according to embodiments includes the ammonium compound providing an ammonium ion capable of converting silicic acid, which may cause the abnormal growth phenomenon when a nitride is etched by using phosphoric acid, into a water-soluble compound, thereby increasing nitride film-to-oxide film etch selectivity and preventing the abnormal growth phenomenon, in which the thickness of an oxide film increases due to reaction by-products.

In some embodiments of the inventive concepts, the amount of the siloxane compound in the etchant composition may be equal to or greater than the amount of the ammonium compound. In some other embodiments, the amount of the siloxane compound in the etchant composition may be less than the amount of the ammonium compound.

The etchant composition according to embodiments of the inventive concepts may further include an amine compound. The amine compound may include methylamine, ethylamine, propylamine, isopropyl amine, 2-aminopentane, dimethylamine, methylethanolamine, trimethylamine, triphenylamine, or combinations of two or more thereof. Like the ammonium compound, the amine compound may suppress the abnormal growth phenomenon on a surface of an oxide film exposed to the etchant composition together with a nitride film upon the etching of the nitride film.

In some embodiments of the inventive concepts, the amine compound may be present in an amount of about 0.1 wt % to about 10 wt % based on the total amount of the etchant composition. If the amount of the amine compound is too low, it may be difficult for the amine compound to help in controlling the abnormal growth phenomenon on a surface of an oxide film exposed to the etchant composition together with a nitride film upon the etching of the nitride film, and if the amount of the amine compound is too high, nitride film-to-oxide film etch selectivity may be deteriorated.

When the etchant composition further includes the amine compound, the amount of the siloxane compound in the etchant composition may be less than a sum of the amount of the ammonium compound and the amount of the amine compound, although the inventive concept is not limited thereto.

The etchant composition according to embodiments of the inventive concepts may further include a fluorine compound. The fluorine compound may include hydrogen fluoride, ammonium fluoride, ammonium hydrogen fluoride, or combinations of two or more thereof. The fluorine compound may increase an etch rate of a nitride film.

In some embodiments of the inventive concepts, the fluorine compound may be present in an amount of about 0.01 wt % to about 1 wt % based on the total amount of the etchant composition. If the amount of the fluorine compound is too low, a nitride film may not be easily removed due to reduction in etch rate of the nitride film, and if the amount of the fluorine compound is too high, there may be a problem in that an oxide film, which is exposed to the etchant composition together with a nitride film, is also etched despite significant improvement in etch rate of the nitride film.

The etchant composition according to embodiments of the inventive concepts may further include at least one of a surfactant, a sequestering agent, and a metal corrosion inhibitor.

The surfactant may remove etched residues while a nitride film is etched by using the etchant composition. The surfactant may include an anionic surfactant, a cationic surfactant, a non-ionic surfactant, or combinations of two or more thereof. For example, the surfactant may include cetyltrimethylammonium chloride (CTAC), dodecyltrimethylammonium chloride (DTAC), monoethanolamine lauryl sulfate (MLS), dodecylbenzenesulfonic acid (DBSA), or the like, although the inventive concept is not limited thereto.

Each of the sequestering agent and the metal corrosion inhibitor may protect a metal film, which is exposed to the etchant composition together with a nitride film while the nitride film is etched by using the etchant composition. In some embodiments, the sequestering agent may include ethylenediaminetetraacetic acid (EDTA), and the metal corrosion inhibitor may include a triazole, an imidazole, a thiol compound, or the like, although the inventive concept is not limited thereto.

FIG. 1 illustrates a flowchart of a method of fabricating an integrated circuit device, according to embodiments of the inventive concepts.

Referring to FIG. 1, in a process P12, a substrate is prepared.

In some embodiments, the substrate may for example have the same configuration as a substrate 102 described below with reference to FIG. 4A.

In a process P14 of FIG. 1, a structure having a surface, at which an oxide film and a nitride film are exposed, is formed on the substrate.

The oxide film may include a silicon oxide film. In some embodiments of the inventive concepts, the oxide film may for example include spin on dielectric (SOD) oxide, high density plasma (HDP) oxide, thermal oxide, borophosphosilicate glass (BPSG), phosphosilicate glass (PSG), borosilicate glass (BSG), polysilazane (PSZ), fluorinated silicate glass (FSG), low pressure tetraethylorthosilicate (LP-TEOS), plasma enhanced tetraethylorthosilicate (PE-TEOS), high temperature oxide (HTO), medium temperature oxide (MTO), undoped silicate glass (USG), spin on glass (SOG), atomic layer deposition (ALD) oxide, plasma enhanced oxide (PE oxide), $O_3$-TEOS, or combinations of two or more thereof, or other oxide films.

The nitride film may for example include $Si_3N_4$, SiON, SiCN, SiOCN, or combinations of two or more thereof, or other nitride films.

In a process P16 of FIG. 1, an etchant composition, which includes an inorganic acid, a siloxane compound represented by General Formula (I), an ammonium compound, and a solvent, is brought into contact with the structure formed in the process P14, thereby selectively removing the nitride film from the oxide film and the nitride film.

The etchant composition may include the etchant composition including various components in various amounts, according to embodiments of the inventive concepts as described above.

To selectively remove the nitride film, the etchant composition may be simultaneously brought into contact with the oxide film and the nitride film. In some embodiments, to bring the etchant composition into contact with the structure, the substrate including the structure may be dipped into the etchant composition. In some other embodiments, to bring the etchant composition into contact with the structure, the etchant composition may for example be applied onto the substrate including the structure in the manner of spray or spin coating.

In the process P16, while the nitride film is selectively removed, the etchant composition may be maintained at a temperature of about 50° C. to about 300° C. For example, while the etchant composition is maintained at a temperature of about 100° C. to about 200° C., the etchant composition may be brought into contact with the structure, thereby selectively removing the nitride film. However, the inventive concepts are not limited to the example temperature range set forth above, and the temperature range may vary considering other process conditions involved in the nitride film etching process, as needed.

According to the method of fabricating an integrated circuit device of embodiments of the inventive concept, when a nitride film and an oxide film are alternately stacked or mixed on the substrate, only the nitride film may be selectively etched with a relatively high nitride film-to-oxide film etch selectivity of about 200:1 to about 600:1 by using the etchant composition according to embodiments. In addition, while the nitride film is etched by using the etchant composition, the stability and reliability of the nitride film etching process may be secured by preventing the generation of unnecessary particles, undesired abnormal growth of by-products on a surface of the oxide film, or the like, and the productivity of a fabrication process of an integrated circuit device and the reliability of the integrated circuit device may be improved by preventing damage to the oxide film, which is exposed to the etchant composition together with the nitride film, or deterioration in electrical properties of the oxide film.

Figure 2:
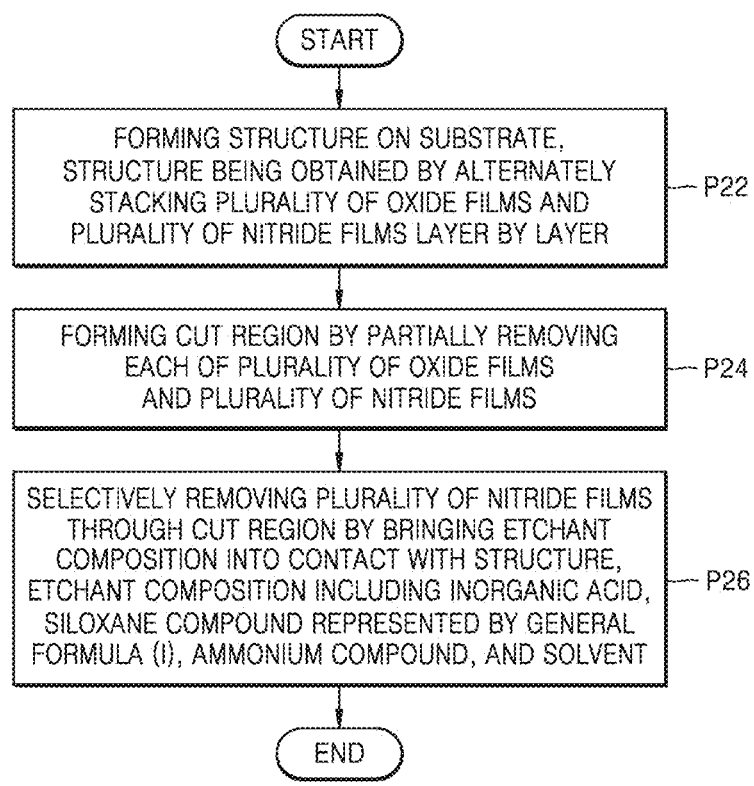
FIG. 2 illustrates a flowchart of a method of fabricating an integrated circuit device, according to other embodiments of the inventive concept.

FIG. 2 illustrates a flowchart of a method of fabricating an integrated circuit device, according to other embodiments of the inventive concepts.

In a process P22 of FIG. 2, a structure obtained by alternately stacking a plurality of oxide films and a plurality of nitride films layer by layer is formed on a substrate.

In some embodiments of the inventive concepts, the substrate may have the same configuration as the substrate 102 described below with reference to FIG. 4A.

In some embodiments of the inventive concepts, the structure may include at least 24 pairs of oxide and nitride films. For example, the structure may include various numbers of pairs of oxide and nitride films, such as 24, 32, 48, or 64 pairs of oxide and nitride films. The structure may include any number of pairs of oxide and nitride films. In some embodiments, the plurality of oxide films may include silicon oxide films, and the plurality of nitride films may include silicon nitride films, although the inventive concept is not limited thereto.

In the structure, each of the plurality of oxide films and the plurality of nitride films may be stacked to extend parallel to an extension direction of a main surface of the substrate.

Relating to descriptions of the plurality of oxide films and the plurality of nitride films, reference may be made to the descriptions made as to the oxide and nitride films in the process P14 with reference to FIG. 1.

In a process P24, each of the plurality of oxide films and the plurality of nitride films is partially removed, thereby forming a cut region having an inner sidewall, at which the plurality of oxide films and the plurality of nitride films are exposed.

The cut region may extend in a line shape along a plane perpendicular to the main surface of the substrate. The cut region may penetrate all of at least 24 pairs of oxide and nitride films constituting the structure. The cut region may penetrate all of the pairs of oxide and nitride films constituting the structure.

In a process of P26, an etchant composition, which includes an inorganic acid, a siloxane compound represented by General Formula (I), an ammonium compound, and a solvent, is brought into contact with the structure including the cut region, thereby selectively removing the plurality of nitride films among the plurality of oxide films and the plurality of nitride films through the cut region.

The etchant composition may include various components in various amounts, according to embodiments of the inventive concepts as described above.

To selectively remove the plurality of nitride films, the etchant composition may be simultaneously brought into contact with the plurality of oxide films and the plurality of nitride films. In some embodiments, to bring the etchant composition into contact with the structure, the substrate including the structure may be dipped into the etchant composition, or the etchant composition may for example be applied onto the substrate including the structure in the manner of spray or spin coating.

In the process P26, while the plurality of nitride films are selectively removed, the etchant composition may be maintained at a temperature of about 50° C. to about 300° C.

Figure 3:
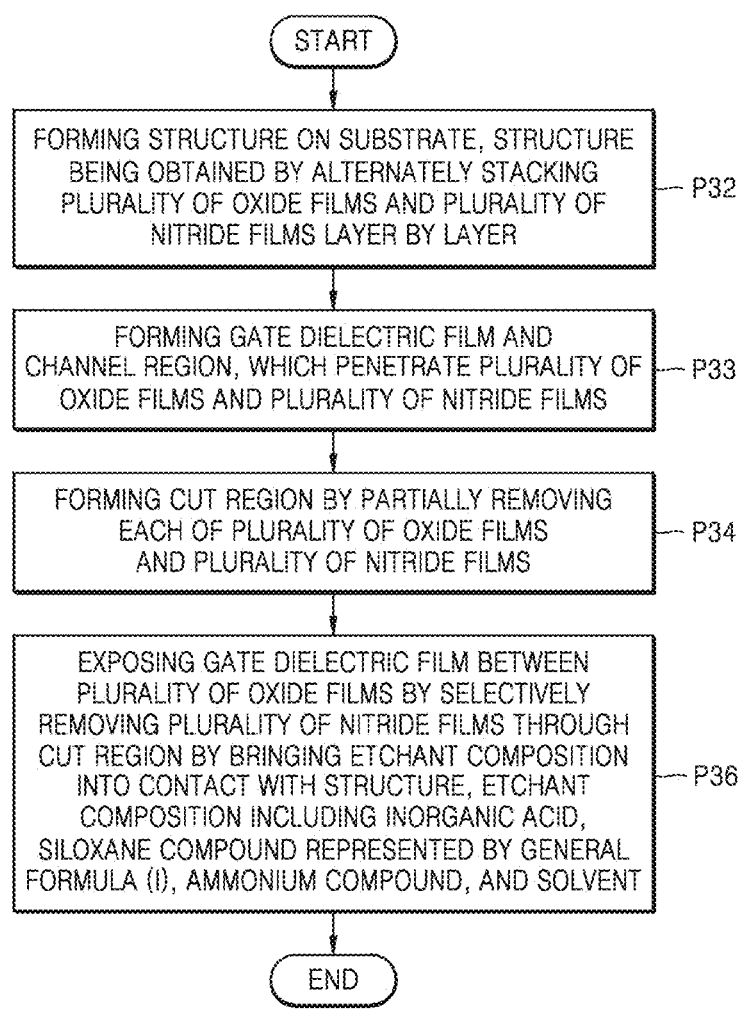
FIG. 3 illustrates a flowchart of a method of fabricating an integrated circuit device, according to further embodiments of the inventive concept.

FIG. 3 illustrates a flowchart of a method of fabricating an integrated circuit device, according to further embodiments of the inventive concepts.

In a process P32 of FIG. 3, a structure obtained by alternately stacking a plurality of oxide films and a plurality of nitride films layer by layer is formed on a substrate in the same manner as in the process P22 of FIG. 2.

In a process P33, a gate dielectric film and a channel region surrounded by the gate dielectric film are formed, the gate dielectric film penetrating the plurality of oxide films and the plurality of nitride films in the structure formed in the process P32.

The gate dielectric film may include an oxide film. For example, the gate dielectric film may include a silicon oxide film, a hafnium oxide film, an aluminum oxide film, a zirconium oxide film, a tantalum oxide film, or combinations of two or more thereof, or other oxide films.

In a process P34, in the same manner as in the process P24 of FIG. 2, each of the plurality of oxide films and the plurality of nitride films is partially removed, thereby forming a cut region having an inner sidewall, at which the plurality of oxide films and the plurality of nitride films are exposed.

In a process P36, in a similar manner to that in the process P26 of FIG. 2, an etchant composition, which includes an inorganic acid, a siloxane compound represented by General Formula (I), an ammonium compound, and a solvent, is brought into contact with the structure including the cut region, thereby selectively removing the plurality of nitride films among the plurality of oxide films and the plurality of nitride films through the cut region. However, in the process P36, the plurality of nitride films are selectively removed, thereby exposing the gate dielectric film between the plurality of oxide films. A portion of the gate dielectric film, which is exposed between the plurality of oxide films, may include an oxide film. For example, the portion of the gate dielectric film, which is exposed between the plurality of oxide films, may include a silicon oxide film, a hafnium oxide film, an aluminum oxide film, a zirconium oxide film, a tantalum oxide film, or combinations of two or more thereof.

As technology advances and VNAND devices become increasingly highly down-scaled, although the height of vertical channels in devices has increased, intervals between the vertical channels have become more narrow. Along with such a trend, there may be a need to perform a process of selectively removing only a plurality of nitride films from a structure including pairs of a plurality of oxide films and the plurality of nitride films, which have finer sizes and a further increased number of layers, through a more narrow and deeper cut region. According to the method of fabricating an integrated circuit device according to embodiments of the inventive concepts as described with reference to FIGS. 2 and 3, even in a process of fabricating a 3-dimensional vertical-structure memory device such as a VNAND device, only a plurality of nitride films may be selectively etched from a structure which is obtained by alternately stacking a plurality of oxide films and a plurality of nitride films layer by layer, through a narrow and deep cut region, and etch selectivity of the plurality of nitride films with respect to the plurality of oxide films may be provided as a relatively high etch selectivity of about 200:1 to about 600:1. In addition, while the plurality of nitride films are etched by using the etchant composition, the stability and reliability of the etching process of the plurality of nitride films may be secured by preventing the generation of unnecessary particles, undesired abnormal growth of by-products on surfaces of the plurality of oxide films, or the like, and damage to the plurality of oxide films which are exposed to the etchant composition together with the plurality of nitride films, or deterioration in electrical properties of the plurality of oxide films may be prevented. Further, amounts of by-products, which remain in the etchant composition after the plurality of nitride films are etched by using the etchant composition, may be minimized. Therefore, since a nitride film etching process may be performed on a larger number of substrates by using a certain amount of the etchant composition prepared once, fabrication costs of the integrated circuit device may be reduced and the productivity thereof may be improved.

Figure 4A:
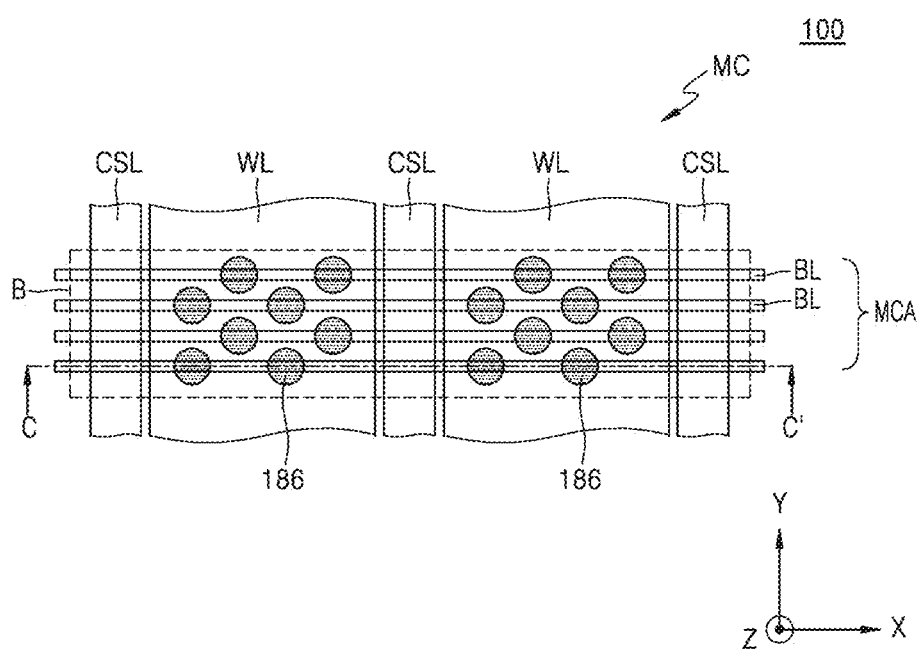
FIG. 4A illustrates a plan view of main components of an example of an integrated circuit device realized by a method of fabricating an integrated circuit device, according to embodiments of the inventive concept.
Figure 4B:
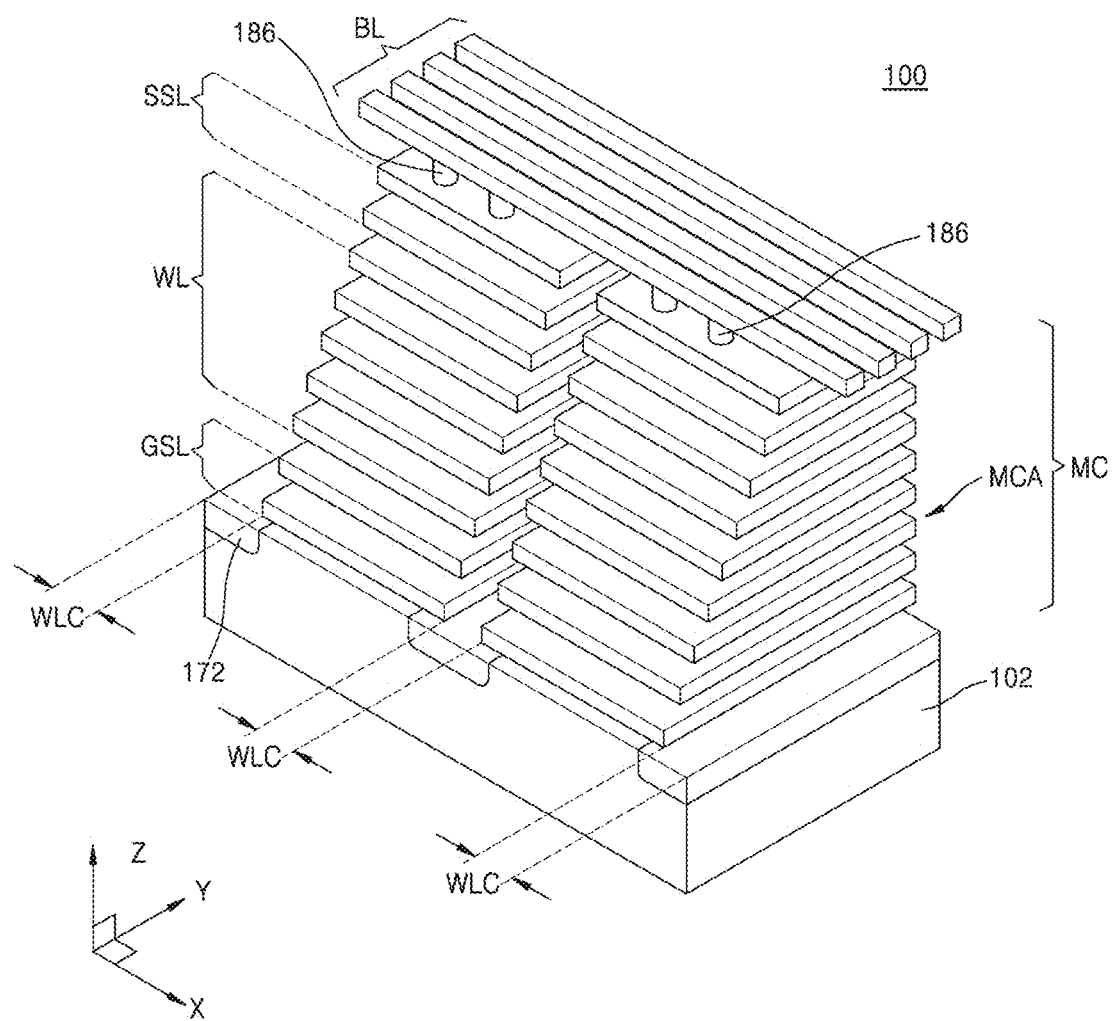
FIG. 4B illustrates a schematic perspective view of the main components in an area marked by "B" of FIG. 4A.
Figure 4C:
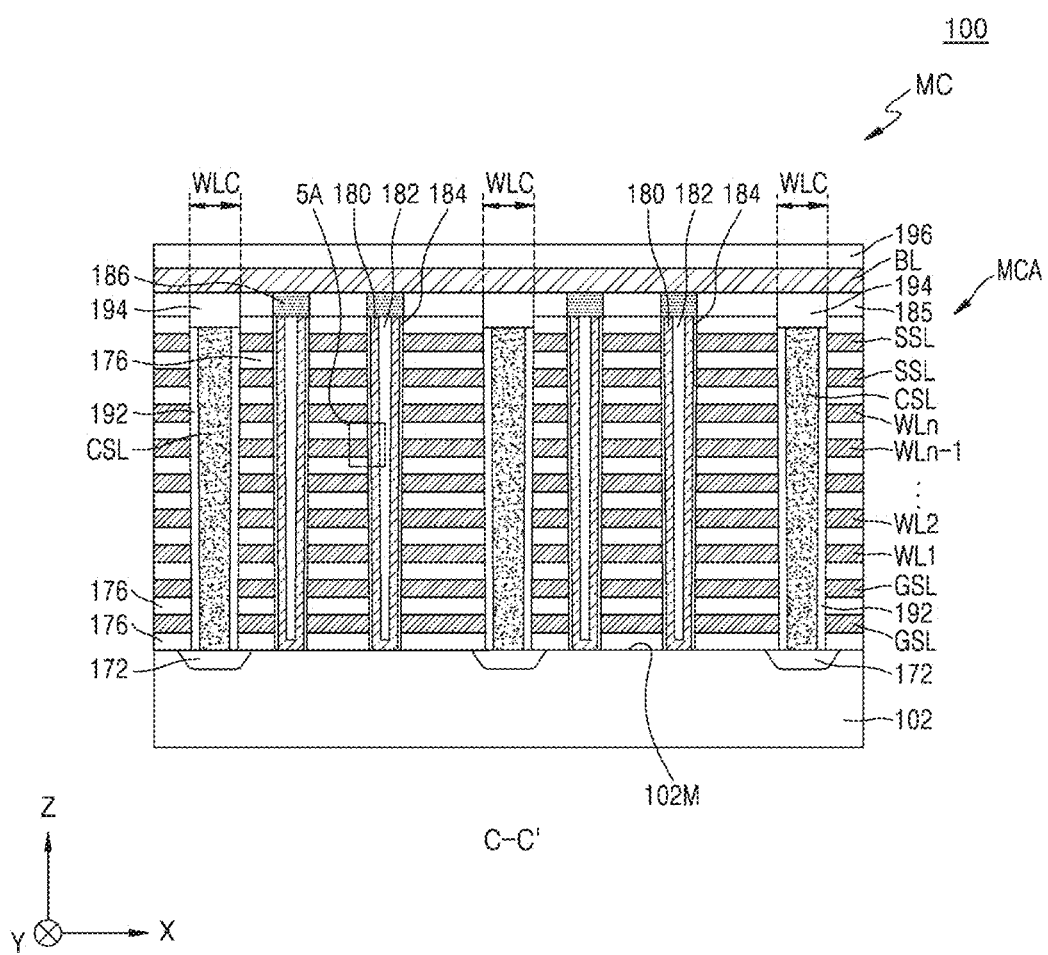
FIG. 4C illustrates a schematic vertical cross-sectional view taken along a line C-C' of FIG. 4A.

FIGS. 4A to 4C are diagrams illustrating an example of an integrated circuit device realized by a method of fabricating an integrated circuit device, according to embodiments of the inventive concepts. In particular, FIG. 4A illustrates a plan view of main components of an integrated circuit device 100, FIG. 4B illustrates a schematic perspective view of the main components in an area marked by "B" of FIG. 4A, and FIG. 4C illustrates a schematic vertical cross-sectional view taken along a line C-C' of FIG. 4A.

Referring to FIGS. 4A to 4C, the integrated circuit device 100 includes a memory cell array region MC on the substrate 102.

The substrate 102 may have a main surface 102M extending in an X direction and a Y direction. The substrate 102 may include for example Si, Ge, or SiGe. In some other embodiments, the substrate 102 may include a silicon-on-insulator (SOI) substrate or a germanium-on-insulator (GeOI) substrate.

The memory cell array region MC of the integrated circuit device 100 includes a plurality of memory cell arrays MCA.

In the memory cell array region MC, a plurality of word lines WL (WL1, WL2, . . . , WLn−1, and WLn) may extend, over the substrate 102, parallel to an extension direction of the main surface 102M of the substrate 102, and may be separated from each other in a direction (Z direction) perpendicular to the main surface 102M of the substrate 102 and overlap each other. The plurality of word lines WL (WL1, WL2, . . . , WLn−1, and WLn) are separated from each other by constant gaps by a plurality of word line cut regions WLC along a first direction (X direction in FIGS. 4A to 4C) and repeatedly arranged, the first direction being parallel to the extension direction of the main surface 102M of the substrate 102. The plurality of word line cut regions WLC define widths of the plurality of word lines WL (WL1, WL2, . . . , WLn−1, and WLn) along the first direction, and extend parallel to each other in a second direction (Y direction in FIGS. 4A to 4C), which is perpendicular to the first direction, along a plane (Y-Z plane) perpendicular to the main surface 102M of the substrate 102.

In the substrate 102, a plurality of common source regions 172 may extend along the extension direction of the word line cut regions WLC (Y direction in FIGS. 4A to 4C). In some embodiments, the plurality of common source regions 172 may for example be impurity regions doped with n-type impurities at a high concentration. The plurality of common source regions 172 may be used as source regions supplying currents to vertical memory cells. A plurality of common source lines CSL may extend on the common source regions 172 along the extension direction of the word line cut regions WLC (Y direction in FIGS. 4A to 4C). Each of the plurality of common source lines CSL may be formed at one side of a pair of ground selection lines GSL, the word lines WL (WL1, WL2, . . . , WLn−1, and WLn), and a pair of string selection lines SSL and partially fill a word line cut region WLC.

At least one ground selection line GSL, the plurality of word lines WL (WL1, WL2, . . . , WLn−1, and WLn), and at least one string selection line SSL may be stacked, in this stated order, between two adjacent word line cut regions WLC. Each of the at least one ground selection line GSL, the plurality of word lines WL (WL1, WL2, . . . , WLn−1, and WLn), and the at least one string selection line SSL may include a metal, a metal silicide, an impurity-doped semiconductor, or combinations of two or more thereof. For example, each of the at least one ground selection line GSL, the plurality of word lines WL (WL1, WL2, . . . , WLn−1, and WLn), and the at least one string selection line SSL may include: a metal such as for example tungsten, nickel, cobalt, tantalum, or the like; a metal silicide such as for example tungsten silicide, nickel silicide, cobalt silicide, tantalum silicide, or the like; impurity-doped polysilicon; or combinations of two or more thereof.

The oxide films 176 are disposed between the substrate 102 and the at least one ground selection line GSL, and between the at least one ground selection line GSL, the plurality of word lines WL (WL1, WL2, . . . , WLn−1, and WLn), and the at least one string selection line SSL. Each of the at least one ground selection line GSL, the plurality of word lines WL (WL1, WL2, . . . , WLn−1, and WLn), and the at least one string selection line SSL may thus be sandwiched by the oxide films 176. The oxide film 176 may include a silicon oxide film for example.

In the memory cell arrays MCA, a plurality of channel regions 180 (see FIG. 4C) may penetrate the at least one ground selection line GSL, the plurality of word lines WL (WL1, WL2, . . . , WLn−1, and WLn), the at least one string selection line SSL, and a plurality of oxide films 176 and extend in the direction (Z direction) perpendicular to the main surface 102M of the substrate 102. The plurality of channel regions 180 may be separated from each other by certain gaps along the X direction and the Y direction. The arrangement of the plurality of channel regions 180 shown in FIG. 4C is merely an example, and the manner of arranging the plurality of channel regions 180 may be variously modified and changed. The plurality of channel regions 180 may be connected to corresponding bit lines BL of a plurality of bit lines BL. The plurality of channel regions 180 may be repeatedly formed at regular pitches. The plurality of channel regions 180 may include for example doped polysilicon, undoped polysilicon, metals, conductive metal nitrides, silicides, carbon nanotubes, graphene, or combinations of two or more thereof, or the like. Each of the plurality of channel regions 180 may have a cylindrical shape. In some embodiments, a filling insulating film 182 may fill an inner space of each of the plurality of channel regions 180. In some other embodiments, the plurality of channel regions 180, unlike those shown in FIGS. 4A and 4C, may have pillar structures, and in this case, the filling insulating film 182 may be omitted.

Each gate dielectric film 184 may be between the plurality of channel regions 180 and each of the at least one ground selection line GSL, the plurality of word lines WL (WL1, WL2, . . . , WLn−1, and WLn), and the at least one string selection line SSL.

Figure 5:
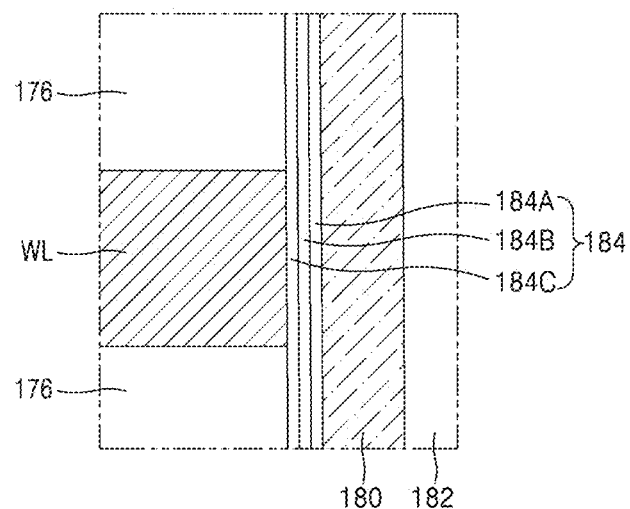
FIG. 5 illustrates a cross-sectional view of an example of a structure of a gate dielectric film of an example of an integrated circuit device realized by a method of fabricating an integrated circuit device, according to embodiments of the inventive concept.

FIG. 5 illustrates an enlarged cross-sectional view of a partial area 5A of FIG. 4C.

Referring to FIG. 5, a gate dielectric film 184 may include a tunnel insulating film 184A, a charge storage film 184B, and a blocking insulating film 184C, which are stacked on a channel region 180 in this stated order towards a word line WL. The tunnel insulating film 184A may include for example a silicon oxide film, a hafnium oxide film, an aluminum oxide film, a zirconium oxide film, a tantalum oxide film, or combinations of two or more thereof, or the like. The charge storage film 184B is a region in which electrons tunneling through the tunnel insulating film 184A from a plurality of channel regions 180 may be stored, and may include for example a silicon nitride film, a boron nitride film, a silicon boron nitride film, an impurity-doped polysilicon film, or combinations of two or more thereof, or the like. The blocking insulating film 184C may include for example a silicon oxide film, a hafnium oxide film, an aluminum oxide film, a zirconium oxide film, a tantalum oxide film, or combinations of two or more thereof, or the like. In some embodiments, the blocking insulating film 184C may include a high-K dielectric film having a higher dielectric constant than a silicon oxide film.

Although in the example is shown in FIGS. 4C and 5 the gate dielectric film 184 extends along an outer sidewall of each channel region 180, embodiments of the inventive concepts are not limited thereto. For example, at least some of the blocking insulating film 184C, the charge storage film 184B, and the tunnel insulating film 184A which constitute the gate dielectric film 184 may extend along bottom surfaces, top surfaces, and sidewalls of the word lines WL to cover surfaces of the word lines WL which face each channel region 180 and the oxide films 176.

Referring again to FIGS. 4A to 4C, an insulating spacer 192 may be formed in each word line cut region WLC and cover a sidewall of each common source line CSL. The insulating spacer 192 may electrically insulate each common source line CSL from the at least one ground selection line GSL, the plurality of word lines WL (WL1, WL2, . . . , WLn−1, and WLn), and the at least one string selection line SSL. Each common source line CSL may include: a metal such as for example tungsten, copper, aluminum, or the like; a conductive metal nitride such as for example titanium nitride, tantalum nitride, or the like; a transition metal such as for example titanium, tantalum, or the like; or combinations of two or more thereof. The insulating spacer 192 may include for example silicon oxide, silicon nitride, silicon oxynitride, or a low-K dielectric material. A word line cut region filling insulating film 194 may be formed on a common source line CSL in each word line cut region WLC.

A plurality of bit line contact pads 186 may be respectively formed on the plurality of channel regions 180. The plurality of bit line contact pads 186 may include for example impurity-doped polysilicon, metals, conductive metal nitrides, or combinations of two or more thereof. A plurality of bit lines BL may be formed over the plurality of bit line contact pads 186. In some embodiments of the inventive concepts, as shown in FIG. 4C, the plurality of bit lines BL may directly contact top surfaces of the plurality of bit line contact pads 186. In some other embodiments, unlike the example shown in FIG. 4C, the plurality of bit lines BL may be connected to the plurality of bit line contact pads 186 through contact plugs (not shown). The plurality of bit lines BL may extend in the direction (X direction) that is parallel to the main surface 102M of the substrate 102. The plurality of bit lines BL may include for example impurity-doped polysilicon, metals, conductive metal nitrides, or combinations of two or more thereof.

An insulating film 185 may be formed between the bit lines BL and the stacked structure, which includes the at least one ground selection line GSL, the plurality of word lines WL (WL1, WL2, . . . , WLn−1, and WLn), and the at least one string selection line SSL. The bit lines BL may be covered with an upper insulating film 196.

FIGS. 6A to 6F illustrate cross-sectional views of sequential processes of a method of fabricating an integrated circuit device, according to embodiments of the inventive concepts. In this example, a method of fabricating the integrated circuit device 100 shown in FIGS. 4A to 4C will be described. FIGS. 6A to 6F schematically illustrate main configurations in areas corresponding to cross-sections taken along the line C-C' of FIG. 4A according to processes of fabricating the integrated circuit device 100. In FIGS. 6A to 6F, the same reference numerals as in FIGS. 4A to 4C denote the same members, and descriptions thereof will be omitted.

Figure 6A:
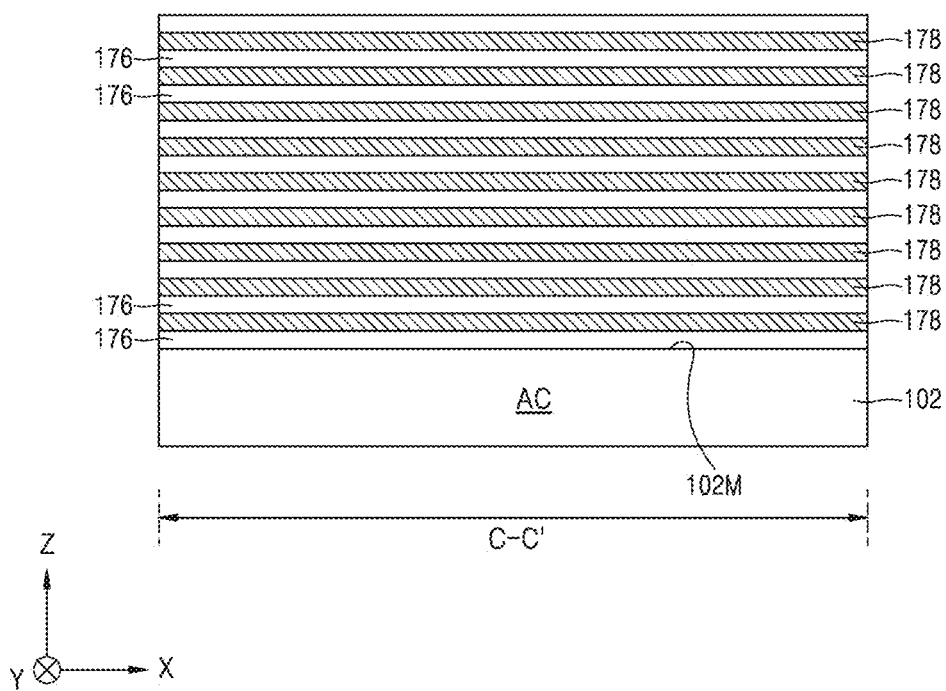
FIGS. 6A, 6B, 6C, 6D, 6E and 6F illustrate cross-sectional views of sequential processes of a method of fabricating an integrated circuit device, according to embodiments of the inventive concept.

Referring to FIG. 6A, a device isolation film (not shown) for defining an active region AC is formed on a substrate 102, followed by forming a structure on the substrate 102, the structure being obtained by alternately stacking a plurality of oxide films 176 and a plurality of nitride films 178 layer by layer. Although the structure is shown as including 9 pairs of an oxide film 176 and a nitride film 178, which are adjacent to each other, in FIG. 6A, this is merely an example chosen for purposes of explanation only, and the structure may include various numbers of pairs of the oxide film 176 and the nitride film 178 adjacent to each other, such as 24, 32, 48, or 64 pairs thereof, as needed. The structure may include any number of pairs of the oxide film 176 and the nitride film 178 adjacent to each other. The plurality of oxide films 176 may include a silicon oxide film. The plurality of nitride films 178 may be silicon nitride. The plurality of nitride films 178 may be preliminary films or sacrificial layers for forming at least one ground selection line GSL, a plurality of word lines WL (WL1, WL2, . . . , WLn−1, and WLn), and at least one string selection line SSL.

Figure 6B:
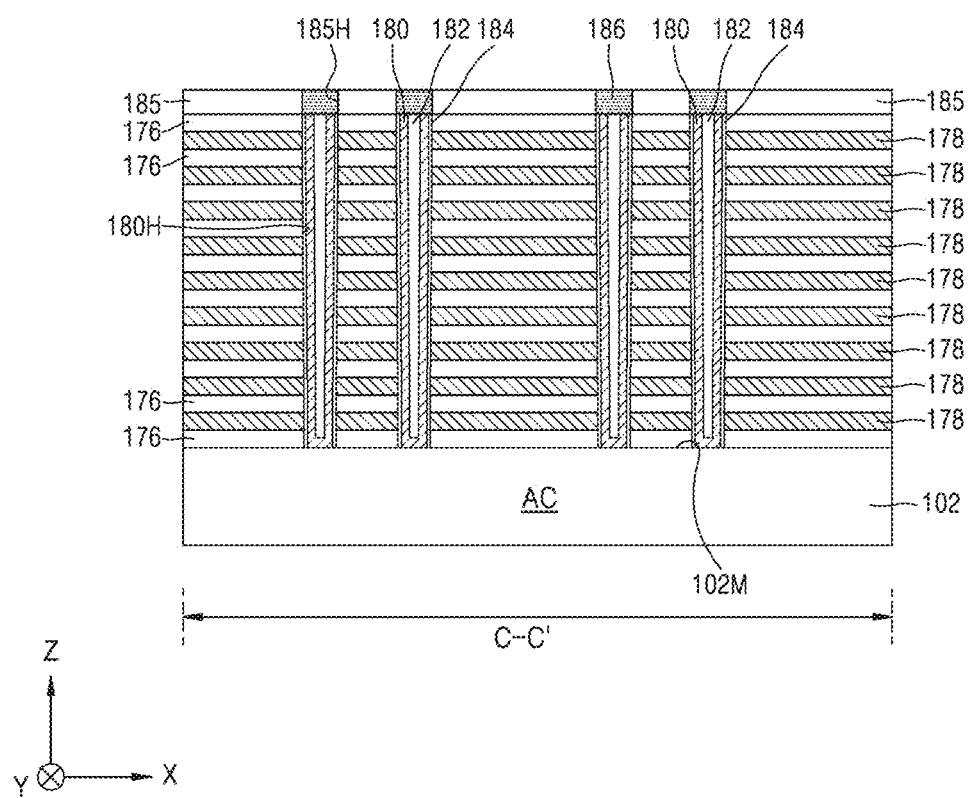

Referring to FIG. 6B, a plurality of channel holes 180H are formed to penetrate the plurality of oxide films 176 and the plurality of nitride films 178, and to extend in a direction (Z direction) perpendicular to a main surface 102M of the substrate 102, followed by forming a gate dielectric film 184, a channel region 180, and a filling insulating film 182 in each of the plurality of channel holes 180H. In each of the plurality of channel holes 180H, the filling insulating film 182 may be surrounded by the channel region 180, and the channel region 180 may be surrounded by the gate dielectric film 184.

Next, an insulating film 185 is formed and covers a top surface of each of the channel region 180, the filling insulating film 182, and the gate dielectric film 184, and a plurality of contact holes 185H are formed in the insulating film 185 to expose top surfaces of the channel region 180, the filling insulating film 182 and the gate dielectric film 184. Next, a plurality of bit line contact pads 186 are formed in the plurality of contact holes 185H.

Figure 6C:
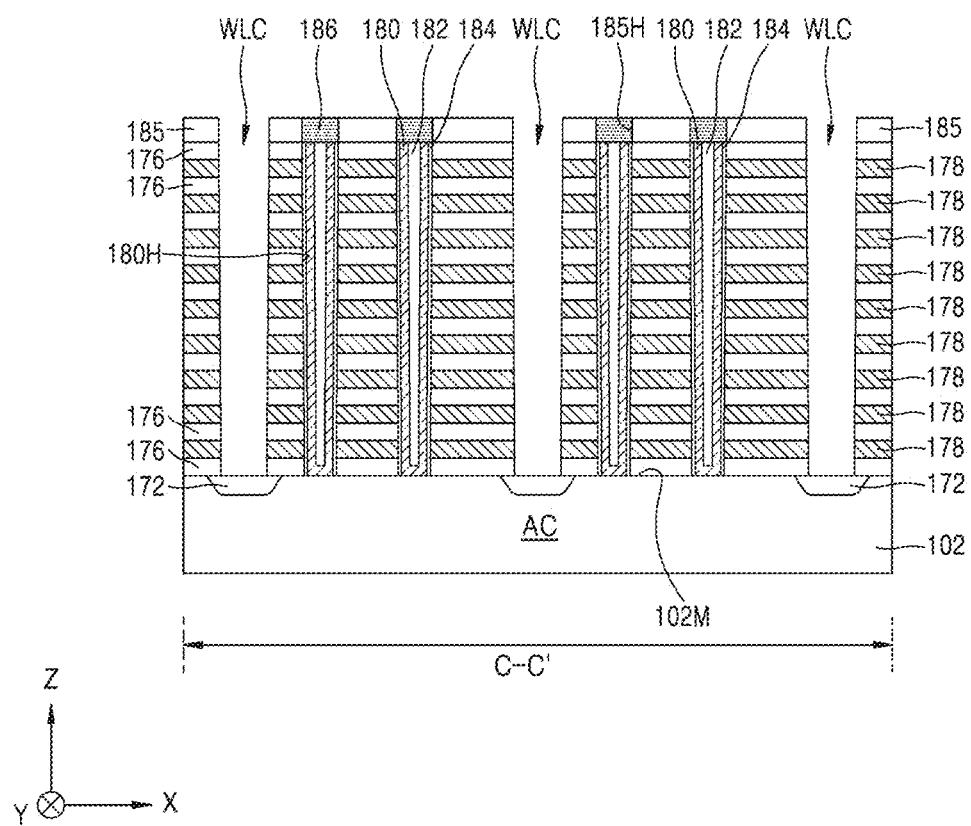

Referring to FIG. 6C, a plurality of word line cut regions WLC are formed through the insulating film 185 to penetrate the plurality of oxide films 176 and the plurality of nitride films 178, and expose the substrate 102, followed by forming a plurality of common source regions 172 by implanting impurity ions into the substrate 102 through the plurality of word line cut regions WLC. The plurality of oxide films 176 and the plurality of nitride films 178 may be exposed at inner sidewalls of the plurality of word line cut regions WLC.

Figure 6D:
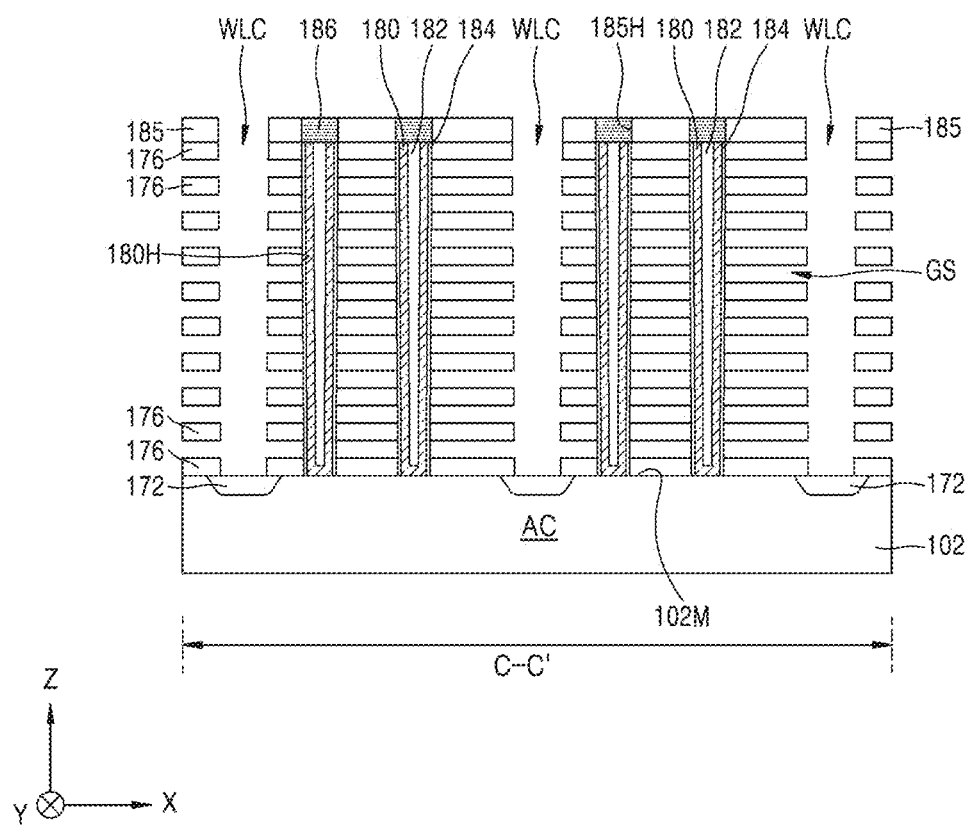

Referring to FIG. 6D, a plurality of gate spaces GS are formed by removing the plurality of nitride films 178 through the plurality of word line cut regions WLC, the plurality of gate spaces GS each being between two of the plurality of oxide films 176. The gate dielectric film 184 may be partially exposed by the plurality of gate spaces GS.

To remove the plurality of nitride films 178, the etchant composition including various components in various amounts, according to the above described embodiments of the inventive concepts, may be used. In some embodiments, to selectively remove the plurality of nitride films 178, the above noted etchant composition may be simultaneously brought into contact with the plurality of oxide films 176 and the plurality of nitride films 178 through the plurality of word line cut regions WLC. In some embodiments, to bring the etchant composition into contact with the structure, the substrate 102 including the plurality of oxide films 176 and the plurality of nitride films 178 may be dipped into the etchant composition. While the plurality of nitride films 178 are selectively removed, the etchant composition may be maintained at a temperature of about 50° C. to about 300° C., for example, about 100° C. to about 200° C.

Only the plurality of nitride films 178 are thus selectively etched from the structure, which is obtained by alternately stacking the plurality of oxide films 176 and the plurality of nitride films 178 on the substrate 102, through the plurality of word line cut regions WLC which are relatively narrow and deep. Here, etch selectivity of the plurality of nitride films 178 with respect to the plurality of oxide films 176 may be provided as a relatively high etch selectivity of about 200:1 to about 600:1. While the plurality of nitride films 178 are etched by using the etchant composition, the generation of unnecessary particles, undesired abnormal growth of by-products on surfaces of the plurality of oxide films 176, or the like may be prevented. Therefore, there is no damage to the plurality of oxide films 176 while the plurality of nitride films 178 are etched by using the etchant composition. In addition, portions of the gate dielectric film 184 may be exposed by the plurality of gate spaces GS, which are formed due to the removal of the plurality of nitride films 178. Here, even when an oxide film, for example, a silicon oxide film or a metal oxide film, constituting the gate dielectric film 184 is exposed by the plurality of gate spaces GS and contacts the etchant composition, the plurality of nitride films 178 may be cleanly removed without damage or consumption of the portions of the gate dielectric film 184, which are exposed to the etchant composition.

Figure 6E:
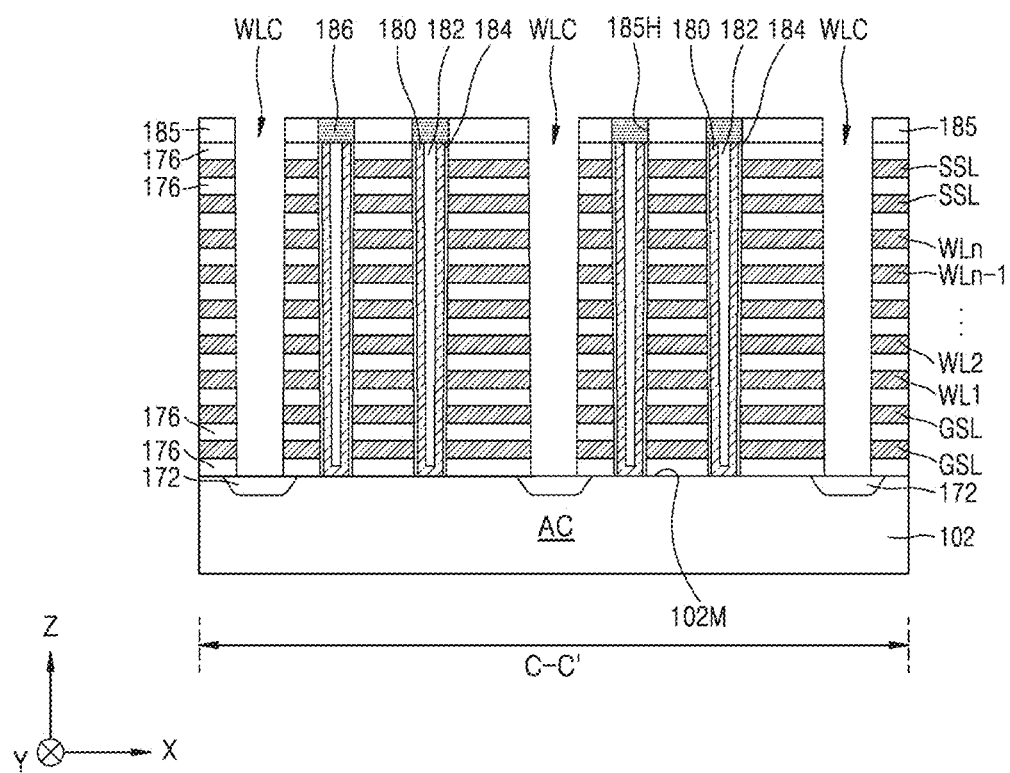

Referring to FIG. 6E, a plurality of ground selection lines GSL, a plurality of word lines WL (WL1, WL2, . . . , WLn−1, and WLn), and a plurality of string selection lines SSL are formed in the plurality of gate spaces GS.

Figure 6F:
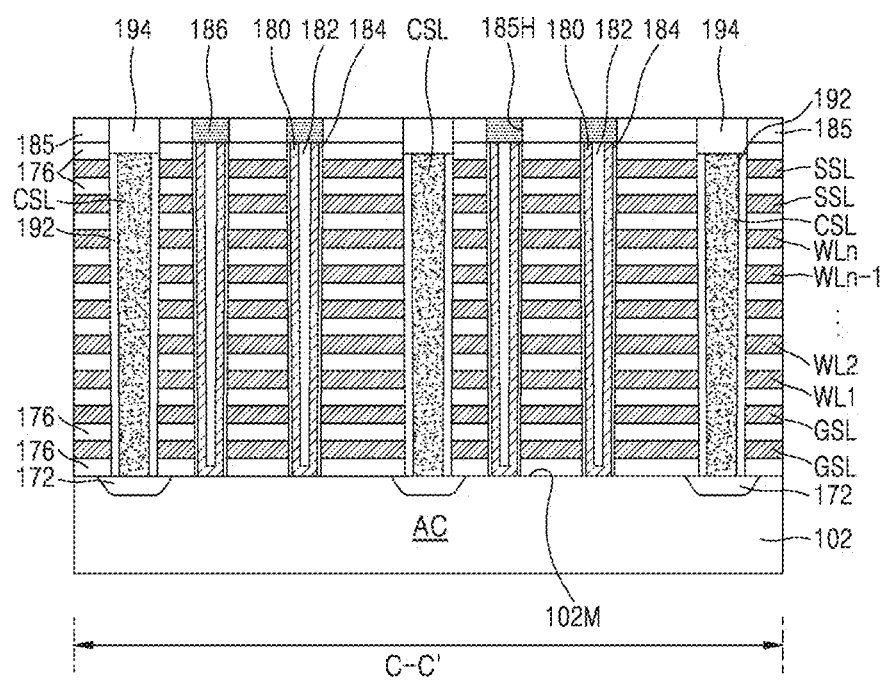

Referring to FIG. 6F, an insulating spacer 192, a common source line CSL, and a word line cut region filling insulating film 194 are formed in each of the plurality of word line cut regions WLC.

Next, a plurality of bit lines BL, each of which is connected to some channel regions 180 selected from among a plurality of channel regions 180, and an upper insulating film 196 covering the plurality of bit lines BL are formed, thereby forming the integrated circuit device 100 shown in FIGS. 4A to 4C.

As described with reference to FIGS. 6A to 6F, according to the method of fabricating an integrated circuit device according to embodiments of the inventive concepts, only the plurality of nitride films 178 are selectively removed from the structure including pairs of the plurality oxide films 176 and the plurality of nitride films 178, through the word line cut regions WLC. In embodiments of the inventive concepts, the structure has finer sizes and increased number of layers, and the word line cut regions WLC are relatively narrow and deep since the vertical channels have greater height and narrower intervals due to the high scaling of the 3-dimensional vertical-structure memory device (e.g., VNAND device). That is, only the plurality of nitride films 178 are selectively etched through the narrow deep word line cut regions WLC, and the etch selectivity of the plurality of nitride films 178 with respect to the plurality of oxide films 176 may be provided as a relatively high etch selectivity of about 200:1 to about 600:1. In addition, while the plurality of nitride films 178 are etched by using the etchant composition, the stability and reliability of the process of etching the plurality of nitride films 178 may be secured by preventing the generation of unnecessary particles, undesired abnormal growth of by-products on the surfaces of the plurality of oxide films 176, or the like, and the plurality of oxide films 176 and a plurality of gate dielectric films 184, which are exposed to the etchant composition, may be prevented from being damaged or exhibiting deteriorated electrical properties.

Evaluation Example 1

Nitride film-to-oxide film etch selectivity was evaluated by using the etchant compositions including various components in various amounts, according to embodiments of the inventive concepts. Results are shown in Table 1.

TABLE 1

| Examples | Etchant compositions | Process temperature (° C.) | Nitride film etch rate (Å/min) | Oxide film etch rate (Å/min) | Nitride film/oxide film etch selectivity |
|---|---|---|---|---|---|
| Example 1 | Phosphoric acid (85 wt %) Chemical Formula (1) 1 wt % Ammonium Phosphate 0.5 wt % | 165 | 72.34 | 0.11 | 657.64 |
| Example 2 | Phosphoric acid (85 wt %) Chemical Formula (2) 1 wt % Ammonium Phosphate 0.5 wt % | | 73.58 | 0.12 | 613.17 |
| Example 3 | Phosphoric acid (85 wt %) Chemical Formula (3) 3 wt % Ammonium Phosphate 0.5 wt % | | 71.89 | 0.15 | 479.27 |
| Example 4 | Phosphoric acid (85 wt %) Chemical Formula (4) 1.5 wt % Ammonium Phosphate 0.5 wt % Trimethylamine 2 wt % | | 72.34 | 0.10 | 723.40 |
| Example 5 | Phosphoric acid (85 wt %) Chemical Formula (5) 2 wt % Ammonium Phosphate 0.5 wt % Isopropylamine 2 wt % DBSA 30 ppm | | 72.33 | 0.13 | 556.38 |
| Comparative Example | Phosphoric acid (85 wt %) | | 74.87 | 3.04 | 24.63 |

In Table 1, the Comparative Example is an example in which nitride films and oxide films were etched by using an etchant composition including only phosphoric acid (85 wt % aqueous solution), and Examples 1 to 5 are examples in which nitride films and oxide films were etched by using etchant compositions including various components in various amounts, according to embodiments of the inventive concepts. More specifically, Example 1 is an example in which nitride films and oxide films were etched by using an etchant composition further including 1 wt % of a siloxane compound represented by Chemical Formula (1) and 0.5 wt % of ammonium phosphate based on a total amount of the etchant composition, in addition to phosphoric acid. Example 2 is an example in which nitride films and oxide films were etched by using an etchant composition further including 1 wt % of a siloxane compound represented by Chemical Formula (2) and 0.5 wt % of ammonium phosphate based on the total amount of the etchant composition, in addition to phosphoric acid. Example 3 is an example in which nitride films and oxide films were etched by using an etchant composition further including 3 wt % of a siloxane compound represented by Chemical Formula (3) and 0.5 wt % of ammonium phosphate based on the total amount of the etchant composition, in addition to phosphoric acid. Example 4 is an example in which nitride films and oxide films were etched by using an etchant composition further including 1.5 wt % of a siloxane compound represented by Chemical Formula (4), 0.5 wt % of ammonium phosphate, and 2 wt % of trimethylamine based on the total amount of the etchant composition, in addition to phosphoric acid. Example 5 is an example in which nitride films and oxide films were etched by using an etchant composition further including 2 wt % of a siloxane compound represented by Chemical Formula (5), 0.5 wt % of ammonium phosphate, 2 wt % of isopropylamine, and 30 ppm of DBSA (i.e., dodecylbenzenesulfonic acid) based on the total amount of the etchant composition, in addition to phosphoric acid. In each of Examples 1 to 5, the etchant composition further included a solvent such as deionized water (DIW).

From the results of Table 1, it could be seen that the etchant compositions according to embodiments of the inventive concepts had significantly higher etch selectivity of nitride films with respect to oxide films than the etchant composition including only the phosphoric acid aqueous solution.

Evaluation Example 2

In etching nitride films by using the etchant compositions according to embodiments of the inventive concepts, effects of Si concentration in the etchant compositions on the etch selectivity of nitride films with respect to oxide films were evaluated.

For this evaluation, etchant compositions having various Si concentrations were prepared by dissolving different amounts of $Si_3N_4$ films in a plurality of test etchant compositions including the etchant composition according to Example 1 of Table 1. In addition, a test structure obtained by alternately stacking a plurality of TEOS films and a plurality of $Si_3N_4$ films layer by layer was formed on a silicon substrate, and a cut region penetrating the test structure was formed. Next, the test structure was dipped into each of the etchant compositions having various Si concentrations, thereby selectively removing the plurality of $Si_3N_4$ films from the test structure through the cut region.

Figure 7A:
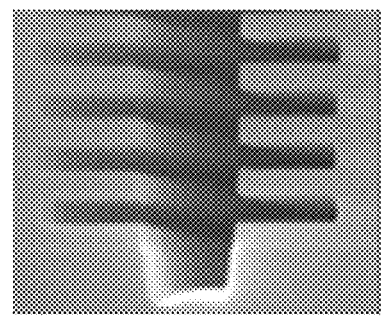
FIGS. 7A and 7B are images showing results of evaluating an effect of a Si concentration in an etchant composition on etch selectivity of a nitride film with respect to an oxide film, when the nitride film is etched by using the etchant composition according to embodiments of the inventive concept.
Figure 7B:
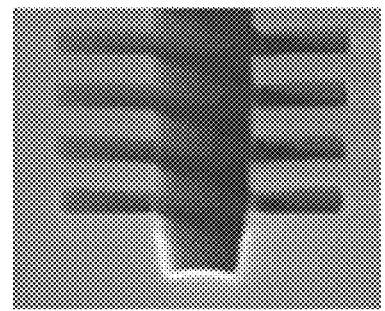

FIG. 7A is an image showing a result when the test structure was etched by using the etchant composition having a Si concentration of 300 ppm, and FIG. 7B is an image showing a result when the test structure was etched by using the etchant composition having a Si concentration of 350 ppm.

From the results of FIGS. 7A and 7B, it was confirmed that the plurality of $Si_3N_4$ films were cleanly removed from the test structure without damage to the plurality of TEOS films or abnormal by-product growth on the plurality of TEOS films.

As can be seen from the results of Evaluation Example 2, even though the Si concentrations in the etchant compositions become higher than before etching the nitride films since the nitride films were dissolved in the etchant compositions, the nitride films may be etched with high etch selectivity without undesired abnormal growth of by-products on surfaces of the oxide films or damage to the oxide films.

Therefore, when a nitride film is etched by using the etchant composition according to embodiments of the inventive concept in a process of fabricating an integrated circuit device, not only one batch of wafers including, for example, 50 wafers but also a relatively large number of wafers corresponding to a plurality of batches, for example, three or more batches, may undergo a nitride film etching process by using a certain amount of the etchant composition prepared once. Therefore, fabrication costs of the integrated circuit device may be reduced, and the productivity thereof may be improved.

While the inventive concepts have been particularly shown and described with reference to embodiments thereof, it will be understood that various changes in form and details may be made therein without departing from the spirit and scope of the following claims.

What is claimed is:

1. An etchant composition comprising:
   phosphoric acid in an amount of about 85 weight % (wt %) of a total amount of the etchant composition;
   a siloxane compound including 1,5-trisiloxanediol, 1,1,3,3,5,5-hexamethyl-, diacetate in an amount of about 1.5 wt % of the total amount of the etchant composition;
   ammonium phosphate in an amount of about 0.5 wt % of the total amount of the etchant composition;
   a solvent; and
   trimethylamine in an amount of about 2.0 wt % of the total amount of the etchant composition.

2. The etchant composition according to claim 1, having a nitride film to oxide film etch selectivity of about 723.40.

3. The etchant composition according to claim 2, wherein the solvent is deionized water (DIW).

4. The etchant composition according to claim 2, wherein the oxide film comprises silicon oxide, and
   the nitride film comprises $Si_3N_4$, SiON, SiCN, SiOCN, or combinations of two or more thereof.

5. An etchant composition comprising:
   phosphoric acid in an amount of about 85 weight % (wt %) of a total amount of the etchant composition;
   a siloxane compound including dimethoxy-propan-2-yl-trimethylsilyloxysilane in an amount of about 1.0 wt % of the total amount of the etchant composition;
   ammonium phosphate in an amount of about 0.5 wt % of the total amount of the etchant composition; and
   a solvent.

6. The etchant composition according to claim 5, having a nitride film to oxide film etch selectivity of about 657.64.

7. The etchant composition according to claim 6, wherein the solvent is deionized water (DIW).

8. The etchant composition according to claim 6, wherein the oxide film comprises silicon oxide, and
   the nitride film comprises $Si_3N_4$, SiON, SiCN, SiOCN, or combinations of two or more thereof.

* * * * *